(12) United States Patent
Kunert et al.

(10) Patent No.: US 9,614,082 B2
(45) Date of Patent: Apr. 4, 2017

(54) AL-POOR BARRIER FOR INGAAS SEMICONDUCTOR STRUCTURE

(71) Applicant: IMEC VZW, Leuven (BE)

(72) Inventors: Bernardette Kunert, Wilsele (BE); Robert Langer, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/208,783

(22) Filed: Jul. 13, 2016

(65) Prior Publication Data
US 2017/0054021 A1 Feb. 23, 2017

(30) Foreign Application Priority Data

Aug. 17, 2015 (EP) .................................... 15181280

(51) Int. Cl.
*H01L 29/00* (2006.01)
*H01L 21/00* (2006.01)
(Continued)

(52) U.S. Cl.
CPC ........ *H01L 29/7846* (2013.01); *H01L 29/045* (2013.01); *H01L 29/0676* (2013.01);
(Continued)

(58) Field of Classification Search
CPC . H01L 29/7846; H01L 29/045; H01L 29/785; H01L 29/42392; H01L 29/0676;
(Continued)

(56) References Cited

U.S. PATENT DOCUMENTS 9,443,940 B1 * 9/2016 Fogel ...................... H01L 29/32
9,520,394 B1 * 12/2016 Basker ................ H01L 27/0886
(Continued)

FOREIGN PATENT DOCUMENTS

WO 2013/121926 8/2013
WO 2014/209390 12/2014

OTHER PUBLICATIONS

Tiwari, Sandip et al., "Empirical Fit to Band Discontinuities and Barrier Heights in III-V Alloy Systems", Applied Physics Letters, vol. 60, No. 5, Feb. 3, 1992, pp. 630-632.
(Continued)

*Primary Examiner* — Nikolay Yushin
(74) *Attorney, Agent, or Firm* — McDonnell Boehnen Hulbert & Berghoff LLP

(57) ABSTRACT

The present disclosure relates to a semiconductor structure and a method of preparation including a silicon monocrystalline substrate, and a III-V structure abutting the silicon monocrystalline substrate. The semiconductor structure includes an $In_aGa_bAs$ structure overlaying the III-V structure, where a is from 0.40 to 1, b from 0 to 0.60, and a+b equal to 1.00. The III-V structure has a top surface facing away from the silicon substrate. The top surface is $Ga_gX_x$-$P_pSb_sZ_z$, where X includes one or more group III elements other than Ga and Z is one or more group V elements other than P or Sb. g is from 0.80 to 1.00, x is from 0 to 0.20, z is from 0 to 0.30, p is from 0.10 to 0.55, and s is from 0.50 to 0.80, g+x is equal to 1.00 and p+s+z is equal to 1.00.

20 Claims, 8 Drawing Sheets

(51) Int. Cl.
  *H01L 29/78*   (2006.01)
  *H01L 29/04*   (2006.01)
  *H01L 29/205*  (2006.01)
  *H01L 29/423*  (2006.01)
  *H01L 29/06*   (2006.01)

(52) U.S. Cl.
  CPC ...... *H01L 29/205* (2013.01); *H01L 29/42392* (2013.01); *H01L 29/785* (2013.01)

(58) Field of Classification Search
  CPC ............. H01L 29/205; H01L 21/02381; H01L 21/02639; H01L 21/02516; H01L 21/2521
  See application file for complete search history.

(56) References Cited

U.S. PATENT DOCUMENTS

| | | |
|---|---|---|
| 2013/0119347 A1 | 5/2013 | Cho et al. |
| 2014/0252478 A1 | 9/2014 | Doornbos et al. |
| 2014/0264438 A1 | 9/2014 | Holland et al. |
| 2014/0329376 A1 | 11/2014 | Sanchez et al. |
| 2016/0343705 A1* | 11/2016 | Basker .................. H01L 29/785 |

OTHER PUBLICATIONS

Waldron, N. et al., "An InGaAs/InP Quantum Well FinFet Using the Replacement Fin Process Integrated in an RMG Flow on 300mm Si Substrates", 2014 Symposium on VLSI Technology Digest of Technical Papers, Jun. 9-12, 2014, pp. 1-2.

* cited by examiner

AL-POOR BARRIER FOR INGAAS SEMICONDUCTOR STRUCTURE

CROSS-REFERENCE TO RELATED APPLICATIONS

The present application is a non-provisional patent application claiming priority to European Patent Application No. EP 15181280.7, filed on Aug. 17, 2015, the contents of which are hereby incorporated by reference.

FIELD OF THE DISCLOSURE

The present disclosure relates to the field of semiconductor structures and more in particular to Al-poor or Al-free barrier for use with InGaAs semiconductor structures.

BACKGROUND

Si based transistor scaling is now reaching its physical limits, therefore the application of new materials such as July compound materials to replace the Si channel is under great attention due to their high electron transport properties. The III/V compound material system $In_aGa_bAs$ wherein a is from 0.40 to 1.00, b is from 0 to 0.60, and a+b is 1.00, reveals a very high electron mobility. At present the realization of n-multi gate device based on $In_aGa_bAs$ is a main research focus.

However, the large lattice mismatch between Si and $In_aGa_bAs$ requires an integration approach involving the use of a buffer layer between the Si and the $In_aGa_bAs$ which improves crystal quality and reduce defect density in the $In_aGa_bAs$ channel layer. A popular buffer layer is InP. InP may provide that, in addition to match the lattice constant of $In_aGa_bAs$ where a is 0.535 and b is 0.465, it can be selectively etched away from the $In_aGa_bAs$ to enable the realization of a gate contact around an $In_aGa_bAs$ wire. However, InP deposition in mass production requires intensive epitaxy tool maintenance linked with the use of a significant amount of trimethylindium. Furthermore, InP easily forms a triangle (pyramidal) shaped growth surface when deposited in trenches, because the {111} crystal facets are very stable. It is more difficult to integrate a $In_aGa_bAs$ channel on this triangle shaped surface than on a flat {001} surface. An additional CMP-step (chemical mechanical polishing) can solve this issue but leads to a more complex integration flow with an additional re-growth step (see N. Waldron et al., 2014 Symp. VLSI Technol. Dig. Tech. Papers, 32-33). Typical growth conditions for InP, in particular on patterned wafers, are low growth temperatures. This leads to a high carbon incorporation into the InP layer, which causes a high leakage current in a n-FinFET device but also leaves more carbon in the growth chamber which has to be removed during cleaning. It is therefore attractive to consider a better ways to form a lattice constant buffer between Si and $In_aGa_bAs$ maintaining the possibility to subsequently expose the $In_aGa_bAs$ channel in order to form a gate contact around it.

Aside from a buffer, a quantum barrier between the buffer and the $In_aGa_bAs$ is often used. In order to ensure an efficient electron confinement in the $In_aGa_bAs$ channel, a sufficiently high hetero-offset in the conduction band towards a barrier layer may be provided. Additionally the carrier leakage is also clearly reduced by a high conduction band offset between the channel and the barrier material. Therefore the final device performance is clearly improved by good electron confinement in the channel and low leakage current between source/drain and also towards the substrate.

In the class of III/V compound material systems, Al-containing alloys tend to have a relative large band gap. Hence the application of Al-containing barrier layers induces a high hetero-offset toward the channel material with low band gap. In current transistor device concepts based on $In_aGa_bAs$ channels, Al-rich layers such as InAlAs and GaAlInAs are used to achieve a high hetero-offset in the conduction band between the channel and the barrier. However, Al-rich layers have numerous disadvantages. First, Al has a very high affinity to bond with O and N. This leads to numerous problems whether the Al-rich layer is grown by aspect ratio trapping in narrow cavities (STI-first, i.e. Shallow Trench Isolation-first approach) or is grown in wide cavities (STI-last approach).

For instance, Al-rich layers have a high affinity for the masks used in patterning processes, making it difficult to maintain the selective area growth (SAG) conditions without deposition on the mask or complicating the subsequent removal of these parasitic mask deposition. This is leading to a poorly controlled Al-rich layer deposition.

In the STI-first approach, the Al-rich material will form stacking faults and twins when the material comes in contact with the STI mask during SAG It is therefore very difficult to obtain a defect-free selective epitaxial growth (SEG). These planar crystal defects clearly affect the quality of the overgrown $In_aGa_bAs$ channel and degrade all device performance.

In the STI-last approach, the Fin-etch process such as selective etching is very sensitive to material properties of the different layer stacks. In particular an Al-rich layer easily leads to a deformed (pyramidal) fin shape when a $Ga_aIn_bAs$ channel is present on top of it.

There is therefore a need for better ways to form a quantum barrier between Si (or a buffer) and $In_aGa_bAs$, which is Aluminum-poor or Aluminum-free.

SUMMARY

It is an object of the present disclosure to provide semiconductor structures for forming n-type FETs having good performances.

In a first aspect, the present disclosure relates to a semiconductor structure comprising:

a Si monocrystalline substrate, a III-V (monocrystalline) structure abutting (or overlaying) the Si monocrystalline substrate, and an $In_aGa_bAs$ (monocrystalline) structure overlaying the III-V structure, wherein a is from 0.40 to 1.00, b is from 0 to 0.60, and a+b is 1.00, wherein the III-V structure has a top surface facing away from the Si monocrystalline substrate (and adjacent to the $In_aGa_bAs$ structure), the top surface having the chemical composition $Ga_gX_xP_pSb_sZ_z$, wherein X is one or more group III element other than Ga, wherein Z is one or more group V elements other than P or Sb, wherein g is from 0.80 to 1.00, x is from 0 to 0.20, z is from 0 to 0.30, p is from 0.10 to 0.55, and s is from 0.50 to 0.80, g+x is equal to 1.00 and p+s+z is equal to 1.00.

If Z is more than one group V element (e.g. $Z_z$ and $Z'_{z'}$), it is the sum of the subscripts z of these group V elements (e.g. z+z') which must be from 0 to 0.30. Similarly, if X is more than one group III element, it is the sum of the subscripts x of these group III elements which must be from 0 to 0.20.

The III-V structure serves as a lattice constant mismatch buffer and optionally as a quantum barrier. It can therefore also be called a buffering III-V structure. When the semiconductor structure is used to form an n-FET, the $In_aGa_bAs$ structure can also be called an $In_aGa_bAs$ channel.

The use of a Si monocrystalline substrate may provide aspects such as a current standard substrate in microelectronics in view of its low price, its good mechanical properties, its band gap suitable to prevent major current leakage, and its easy doping, amongst other properties.

The use of a III-V structure having a top surface of chemical composition $Ga_gX_xP_pSb_sZ_z$ may provide the $In_aGa_bAs$ structure with a very low amount of defects. Furthermore, the hetero-offset between the conduction band of the $In_aGa_bAs$ structure and the conduction band of the III-V structure can be large. As a result, when the semiconductor structure of the first aspect forms part of a field effect transistor, it shows very good performances due to a better carrier confinement in the $In_aGa_bAs$ channel material. This is especially true for low transistor dimensions. In an example embodiment, this material presents a large band gap. This provides a semiconductor material with a relatively large resistance. This property permits to reduce charge leakage when the semiconductor structure forms part of a field effect transistor. In an example embodiment, the $Ga_gX_xP_pSb_sZ_z$ material is In-poor and can be In-free. Indium requires intensive epitaxy tool maintenance linked with the usage of a significant amount of trimethylindium and the high carbon content due to low growth conditions. Thus, the use of In-poor or In-free materials improves the performance of the tool used to epitaxially grow the III-V material and reduces the average cleaning or maintenance times between two wafers or production periods. Also, it must be deposited at a relatively low temperature. The partial or complete replacement of In by Ga provides for the epitaxial grow step via metal organic precursors which enables the metal organic gas phase growth of III/V at a relatively moderate temperature which leads to a reduced incorporation of carbon and therefore less leakage current. Furthermore, in embodiments, the $Ga_gX_xP_pSb_sZ_z$ material may provide a flat {001} III-V structure top surface for enabling thereon the SAG of $In_aGa_bAs$. For example, $Ga_gX_xP_pSb_sZ_z$ material can be easily tuned to induce a compressive (or tensile) strain in the $In_aGa_bAs$ structure and/or a tensile (or compressive) strain in the $Ga_gX_xP_pSb_sZ_z$ material itself without severely compromising the other aspects of the material. Furthermore, the $Ga_gX_xP_pSb_sZ_z$ material may be Al-poor or Al-free. Al has a high chemical affinity for O and N, two elements that are usually present in STI walls and in masks. As a result, Al-rich III-V materials epitaxially grown between STI walls or in presence of masks, tend to suffer from defect formation, bad deposition control, and/or mask pollution. The III-V structure of the present disclosure being Al-poor or Al-free, such defects and pollutions are avoided or at least reduced.

The use of an $In_aGa_bAs$ structure may provide very high electron mobility.

In an example embodiment, the semiconductor structure of the first aspect may form part of an n-type field effect transistor providing very good performance.

In a second aspect, the present disclosure relates to an n-type Field Effect Transistor comprising a structure according to the first aspect wherein at least one $In_aGa_bAs$ structure forms a channel, wherein the Field Effect Transistor further comprises a source, a drain and a gate structure.

In a third aspect, the present disclosure relates to a method for forming a semiconductor structure comprising the steps of:

Epitaxially growing a III-V structure on a Si monocrystalline substrate, and

Epitaxially growing on the III-V structure at least one $In_aGa_bAs$ structure, wherein the III-V structure has a top surface facing away from the Si monocrystalline substrate, the top surface having the chemical composition $Ga_gX_xP_pSb_sZ_z$, wherein X is one or more group III elements other than Ga, wherein Z is one or more group V element other than P or Sb, wherein g is from 0.80 to 1.00, x is from 0 to 0.20, z is from 0 to 0.30, p is from 0.10 to 0.55, and s is from 0.50 to 0.80, g+x is equal to 1.00 and p+s+z is equal to 1.00.

The above objective is accomplished by a method and device according to the present disclosure.

Particular aspects of the present disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics and features of the present disclosure will become apparent from the following detailed description, taken in conjunction with the accompanying drawings, which illustrate, by way of example, the principles of the structures, devices, and methods described herein. This description is given for the sake of example only, without limiting the scope of the present disclosure. The reference figures quoted below refer to the attached drawings.

Figure 1:
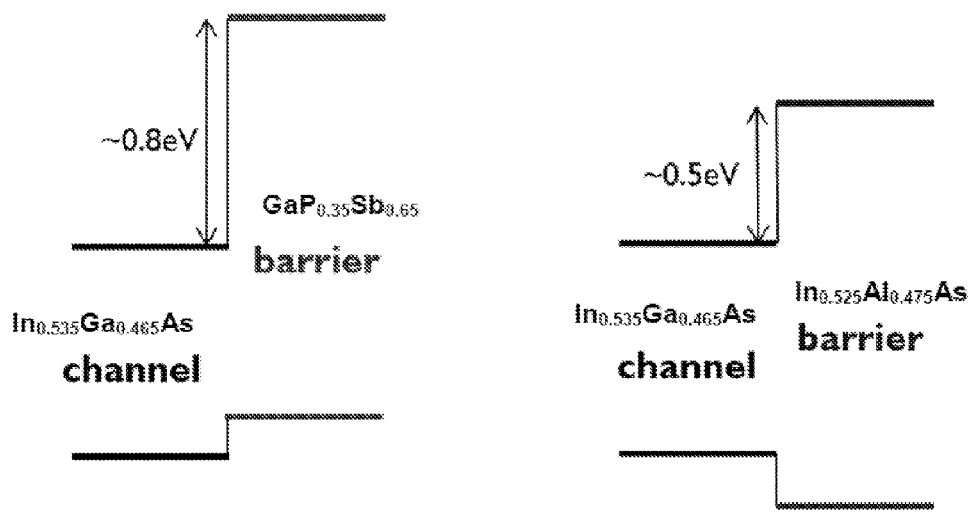
FIG. 1 is a schematic representation of the hetero-offset present between a barrier and a channel in a conventional heterostructure (right) and between a barrier and a channel according to an embodiment of the present disclosure (left).

In the different figures, the same reference signs refer to the same or analogous elements.

DETAILED DESCRIPTION

The present disclosure will be described with respect to particular embodiments and with reference to certain drawings. However, the present disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the structures, devices, and methods described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the structures, devices, and methods described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the structures, devices, and methods, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that a given embodiment requires more features than are expressly recited in each claim. Rather, as the following claims reflect, some aspects lie in less than all features of a single foregoing disclosed embodiment. Thus, the claims following the detailed description are hereby expressly incorporated into this detailed description, with each claim standing on its own as a separate embodiment of the present disclosure.

Furthermore, while some embodiments described herein include some but not other features included in other embodiments, combinations of features of different embodiments are meant to be within the scope of the present disclosure, and form different embodiments, as would be understood by those in the art. For example, in the following claims, any of the claimed embodiments can be used in any combination.

In the description provided herein, numerous specific details are set forth. However, it is understood that embodiments of the present disclosure may be practiced without these specific details. In other instances, well-known methods, structures and techniques have not been shown in detail in order not to obscure an understanding of this description.

The following terms are provided solely to aid in the understanding of the present disclosure.

As used herein and unless provided otherwise, the term "aspect ratio" of an element refers to the ratio between the longer dimension of the element (e.g. its length) and the shorter dimension of the element (e.g. its width).

As used herein and unless provided otherwise, the term "semiconductor fin" relates to semiconductor structures that protrude from a substrate and whose length and height are greater than its width. In an example embodiment, this width is from 2 to 50 nm.

As used herein and unless provided otherwise, the term "nanowire" relates to a nanostructure having the shape of a rod, an aspect ratio of at least 2. In some embodiments, the aspect ratio may be at least 3 or at least 5. The nanostructure may include a width of at most 30 nm. In an example embodiment, the nanostructure may include a width of 2 to 10 nm.

As used herein and unless provided otherwise, the term "nanosheet" relates to a nanostructure having the shape of a sheet and a thickness of from 2 to 10 nm. In an example embodiment, the thickness may be from 2 to 6 nm.

As used herein and unless provided otherwise, the terms "hetero-offset" or "band offset" relate to the difference of energy between energy levels of two different materials. For instance, the energy difference between the conduction band of a first material and the conduction band of a second material is the "conduction band offset".

As used herein and unless provided otherwise, the term "III-V" when characterizing a material, refers to a material made of compounds comprising and possibly consisting of at least one group-III (IUPAC group 13) element and at least one group-V element (IUPAC group 15). This includes binary compounds but also higher order compounds such as ternary compounds or compounds of up to 8 different elements selected in group III and group V.

When a lattice constant of a III-V material is referred to, it is the lattice constant of the zincblende lattice.

As used herein and unless provided otherwise, the term "STI-first" relates to an approach where the III/V material is selectively grown into narrow trenches formed by shallow trench isolation (STI), which could define already the node dimension of the final device. This approach may provide that the material grown between these trenches can accommodate threading dislocations and planar defects (such as stacking faults and twins) ending at the STI walls, thereby reducing the amount of defects in the top surface of that material. Furthermore, this approach may provide that only a low amount of material is necessary to form the III-V structure (buffer+optional barrier) and that the height of the buffer layer can be kept low.

As used herein and unless provided otherwise, the term "STI-last" relates to an approach where the III/V channel layer is deposited first planar onto a (metamorphic) buffer on a whole blanket wafer or selectively in wide fields (boxes and/or trenches) with or without a V-shape bottom and the dimension of the channel is defined by the succeeding STI placement process flow.

The present disclosure will now be described by a detailed description of several embodiments. It is clear that other embodiments can be configured according to the knowledge of persons skilled in the art without departing from the technical aspects of the present disclosure, the present disclosure being limited only by the terms of the appended claims.

Reference will be made to transistors. These are three-terminal devices having a first main electrode such as a drain, a second main electrode such as a source and a control electrode such as a gate for controlling the flow of electrical charges between the first and second main electrodes.

In the first aspect, the present disclosure relates to a semiconductor structure. The semiconductor structure comprises a Si monocrystalline substrate and a III-V structure is abutting the Si monocrystalline substrate. The III-V structure has a top surface facing away from the substrate. The top surface of the III-V structure is overlaid by an $In_aGa_bAs$ structure.

In embodiments, this top surface will have less than $10^8$ threading dislocations per $cm^2$. This low level of defects is achievable due to the aluminium poor nature of the material forming the top surface. Achieving this low level of defects is provided by growing the III-V structure within a space confined by non-crystalline sidewalls, the space having a width smaller than 10 μm. Growing the III-V structure within such a space permits to trap the threading dislocations on the sidewalls. This trapping can be enhanced by annealing the III-V structure during or after deposition. Achieving such a low level of threading dislocations for the top surface of the III-V structure may provide a defect-poor surface to grow the $In_aGa_bAs$ structure.

This in turn permits to obtain a defect-poor $In_aGa_bAs$ structure.

In embodiments, the energy level of the conduction band of the $Ga_gX_xP_pSb_sZ_z$ material of the top surface of the III-V structure may be at least 0.55 eV higher than the energy level of the conduction band of the material forming the $In_aGa_bAs$ structure. The $Ga_gX_xP_pSb_sZ_z$ material typically provides such a high band offset. This is even higher than what is typically obtained by using aluminium-rich barriers. Such a high band offset provides that the electrons stay preferentially in the $In_aGa_bAs$ material and not in the III-V structure.

In embodiments, Z may be N.

In embodiments, X may be one or more group III elements selected from Indium or Boron. In this embodiment, the group III component of the III-V material $Ga_gX_xP_pSb_sZ_z$ is entirely composed of Ga and optionally In and/or B. As such, the III-V material may be Al-free while providing a very good quantum barrier and giving the possibility to etch the III-V material $Ga_gX_xP_pSb_sZ_z$ and the $In_aGa_bAs$ structure together (e.g. in a STI last procedure). For instance, both materials can be dry etched using a $CH_4/H_2/Cl_2$ or $Cl_2/N_2$ chemistry.

In embodiments, Z may be As. Such a structure may provide a very good quantum barrier and gives the possibility to etch the III-V material $Ga_gX_xP_pSb_sZ_z$ and the $In_aGa_bAs$ structure together (e.g. in a STI last procedure).

In an example embodiment, g is 1.00, x is 0, z is 0, p is from 0.25 to 0.45, and s is from 0.55 to 0.75. This embodiment may provide a very high conduction band offset wherein the energy level of the conduction band of the $Ga_gX_xP_pSb_sZ_z$ material of the top surface of the III-V structure is typically at least 0.70 eV higher than the energy level of the conduction band of the material forming the $In_aGa_bAs$ structure. This is exemplified in FIG. 1 where the conduction band offset (about 0.5 eV) of a system of a conventional heterostructure (right) with a $In_{0.535}Ga_{0.465}As$ channel and a $In_{0.525}Al_{0.475}As$ barrier is compared to the conduction band offset (about 0.8 eV) obtained for a system according to an embodiment of the present disclosure (left) with a $In_{0.535}Ga_{0.465}As$ channel and a $GaP_{0.35}Sb_{0.65}$ barrier (providing the top surface of the III-V structure). FIG. 1 is based on S. Tiwari et al., Appl. Phys. Lett. 60, 630 (1992).

Figure 2:
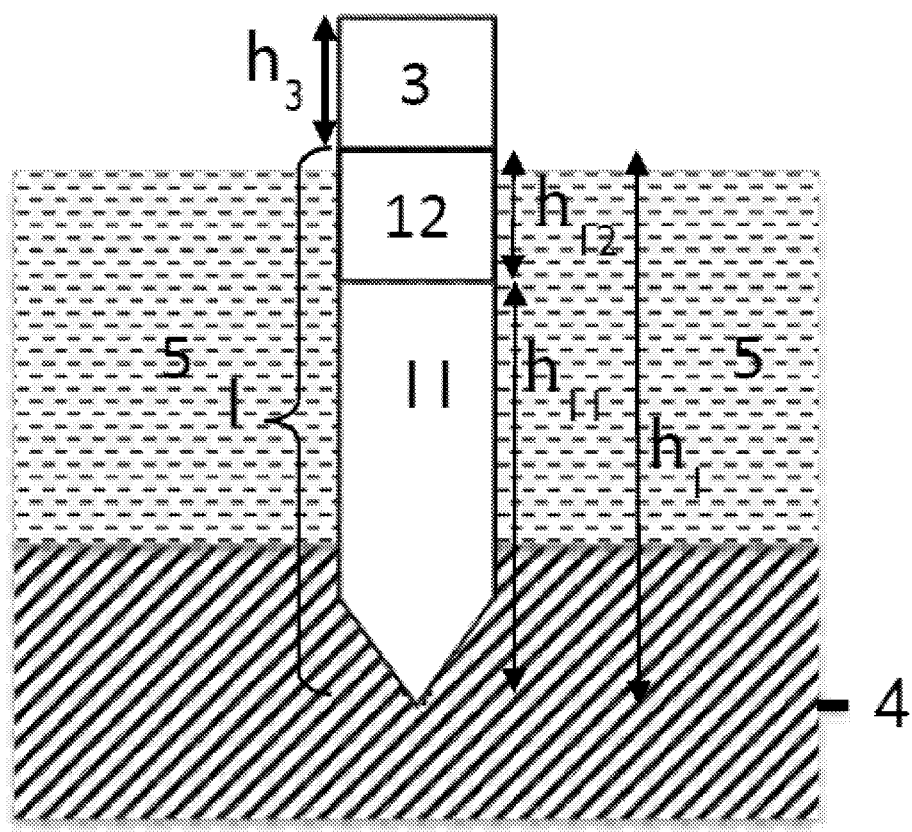
FIG. 2 is a schematic representation of a vertical cross-section of a semiconductor structure according to an embodiment of the present disclosure.
Figure 3:
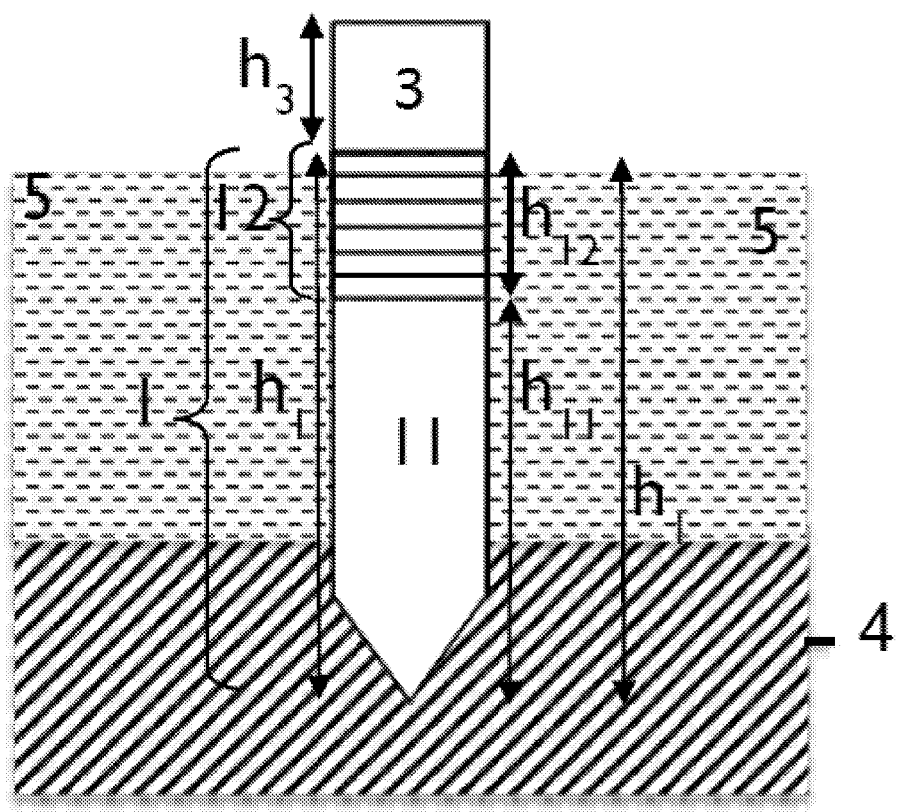
FIG. 3 is a schematic representation of a vertical cross-section of a semiconductor structure according to an embodiment of the present disclosure.
Figure 8:
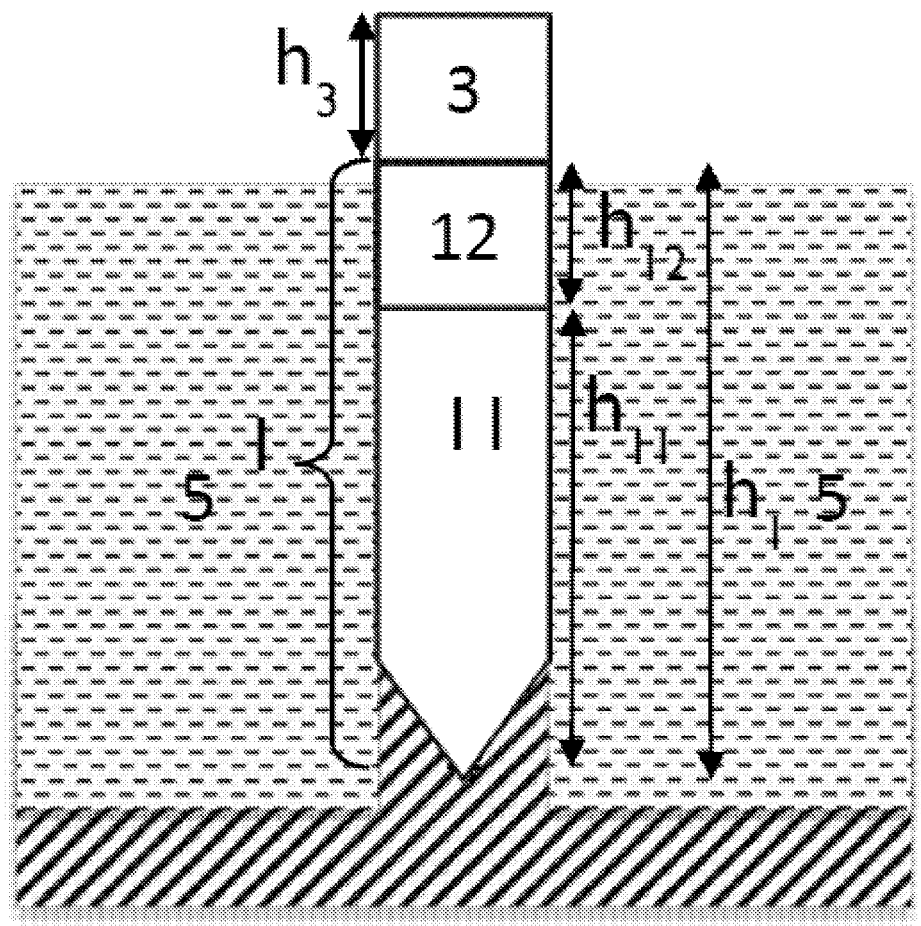
FIG. 8 is a schematic representation of a vertical cross-section of a semiconductor structure according to an embodiment of the present disclosure.

In embodiments illustrated in FIG. 2, FIG. 3, and FIG. 8, the III-V structure (1) may comprise:
a buffer portion (11) abutting the Si monocrystalline substrate (4),
a barrier portion (12), overlaying the buffer portion (11) and comprising the top surface of the structure (1).

In embodiments, the buffer portion (11) may have an upper surface made of a material having a relaxed lattice constant matching the relaxed lattice constant of the $In_aGa_bAs$ material of structure (3). This permits, if the barrier portion (12) is thinner than the critical thickness at which the strain induced in the barrier portion (12) by the lattice constant mismatch between the buffer portion (11) and the barrier portion (12) is relaxed, to avoid stress in the $In_aGa_bAs$ structure (3) while permitting stress in the barrier portion (12) if its relaxed lattice constant is different from the relaxed lattice constant of the buffer portion (11). The mismatch between the relaxed lattice constants can for instance be from 0.1 to 3%.

In other embodiments, the buffer portion (11) may have an upper surface made of a material having a relaxed lattice constant different from the relaxed lattice constant of the $In_aGa_bAs$ material of structure (3). For instance, the buffer portion (11) may have an upper surface made of a material having a relaxed lattice constant larger than the relaxed lattice constant of the $In_aGa_bAs$ material of structure (3). This permits to put the $In_aGa_bAs$ structure (3) under tensile strain. This decreases the band gap of the $In_aGa_bAs$ structure (3) and therefore increases the difference in energy between the conduction band of the $In_aGa_bAs$ structure (3) and the conduction band of the barrier portion (12).

As another example, the buffer portion (11) may have an upper surface made of a material having a relaxed lattice constant smaller than the relaxed lattice constant of the $In_aGa_bAs$ material of structure (3). This permits to put the $In_aGa_bAs$ structure (3) under compressive strain. Such a structure may provide a large hetero offset between the conduction bands of the barrier portion (12) and the $In_aGa_bAs$ structure (3) but increasing the lattice constant of $In_aGa_bAs$ typically involves increasing the indium content of the $In_aGa_bAs$ structure (3), which is beneficial in term of electron mobility.

In embodiments, the barrier portion (12) may be made of a material having a relaxed lattice constant which is different from the relaxed lattice constant of the buffer portion (11). When the relaxed lattice constant varies across the thickness of the barrier portion (12), e.g. when the barrier portion (12) is made of more than one layer, it is the relaxed lattice constant averaged on the complete thickness of the barrier portion (12) that is taken into consideration. The mismatch between the relaxed lattice constants can for instance be from 0.1 to 3%. This permits to put the barrier portion (12) under stress. In such a case, the thickness of the barrier portion (12) may be lower than the critical thickness at which the strain induced in the barrier portion (12) by the lattice constant mismatch between the buffer portion (11) and the barrier portion (12) is relaxed. A typical thickness range where this is typically the case is from 1 to 50 nm, e.g. from 5 to 30 nm.

In an example embodiment, the barrier portion (12) is compressively strained because it induces an increase in the band gap of the barrier portion (12) which leads to a better hetero-offset between the conduction bands of the barrier portion (12) and of the $In_aGa_bAs$ structure (3) respectively. For that purpose, the lattice constant of the barrier portion (12) may be larger than the lattice constant of the buffer portion (11). The mismatch can for instance be from 0.1 to 3%.

In embodiments, the buffer portion (11) may be made of a material selected from InP, $GaAs_xSb_{1-x}$, wherein x is from 0.3 to 0.7 (x may optionally be from 0.4 to 0.6, or from 0.46 to 0.56 (e.g. 0.51)), and $In_aGa_bAs$ wherein the values for a and b are the same as the those selected for the $In_aGa_bAs$ structure (3).

In embodiments illustrated in FIG. 3, the barrier portion (12) may comprise a plurality of layers, the plurality comprising at least two layers of different $Ga_gX_xP_pSb_sZ_z$ chemical composition, wherein X is one or more group III element other than Ga, wherein Z is one or more group V element other than P or Sb, wherein g is from 0.80 to 1.00, x is from 0 to 0.20, z is from 0 to 0.30, p is from 0.10 to 0.55, and s is from 0.50 to 0.80, g+x is equal to 1.00 and p+s+z is equal to 1.00.

For instance, the plurality of layers may comprise from 2 to 14 layers.

For instance, in the plurality comprising at least two layers of different $Ga_gX_xP_pSb_sZ_z$ chemical compositions, X may be one or more group III elements other than Ga, Z may be one or more group V elements other than P or Sb, g may be 1.00, x may be 0, z may be 0, p may be from 0.25 to 0.40, and s may be from 0.60 to 0.75.

As an example embodiment, the at least two layers of different $Ga_gX_xP_pSb_sZ_z$ chemical compositions may comprise:

a first layer wherein p is from 0.36 to 0.40 and wherein s is from 60 to 64, and a second layer wherein p is from 0.25 to 0.34 and wherein s is from 0.66 to 0.75.

For instance, the plurality of layers may comprise a plurality of adjacent repeat units, each repeat unit being formed of the first layer adjacent to the second layer. In embodiments, the number of repeat units may be from 1 to 7.

In embodiments, each of the layer in the plurality of layers may have a thickness of 0.5 nm or more, such as 1 nm or more, 2 nm or more, or 3 nm or more. In embodiments, each of the plurality of layers has a thickness of 50 nm or less, for example 25 nm or less, or 10 nm or less, or 7 nm or less. Any lower limit and any higher limit given above for the thickness of the layers can be combined together to form an embodiment of the present disclosure.

In embodiment, the entire III-V structure may be aluminium free.

Figure 4:
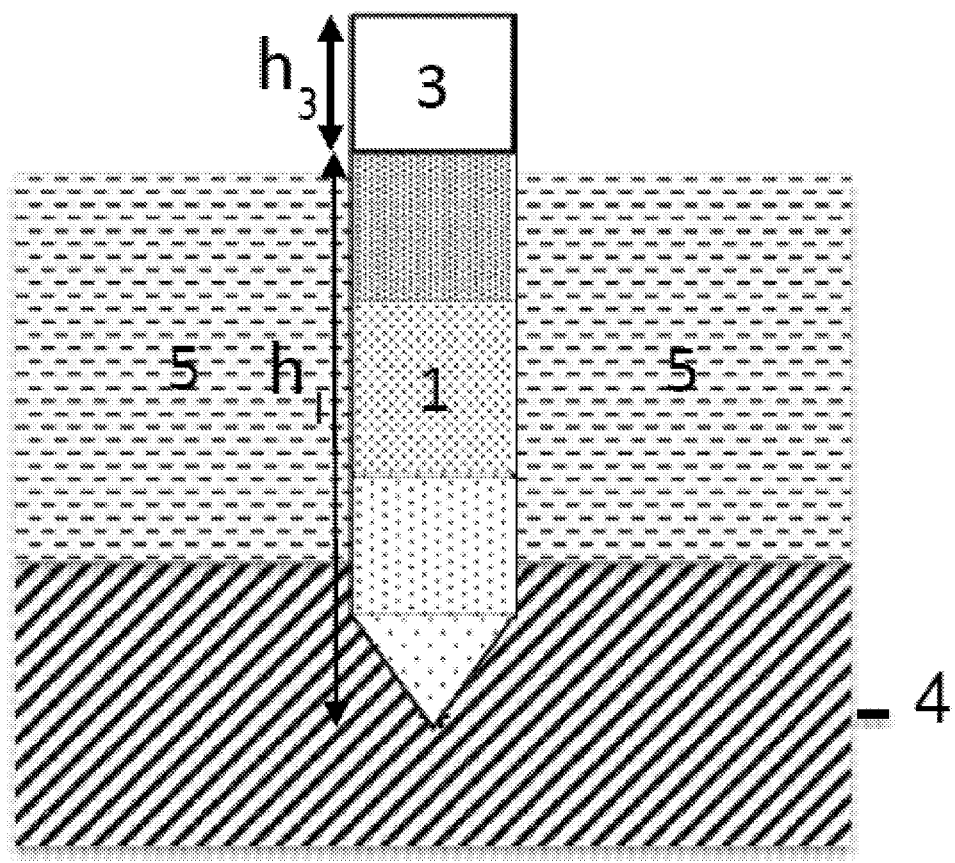
FIG. 4 is a schematic representation of a vertical cross-section of a semiconductor structure according to an embodiment of the present disclosure.

In embodiments illustrated in FIG. 4, the III-V structure (1) may have a bottom abutting with the Si monocrystalline substrate (4) and a composition gradually changing from its bottom to its top surface, wherein the composition at the top surface has a lattice constant matching the lattice constant of the $In_aGa_bAs$ structure (3). The points used as filling for the III-V structure (1) in FIG. 4 are depicted with increasing density from the bottom to the top in order to illustrate the gradual change of the composition.

In an example, the composition at the bottom may be GaP and the composition at the top surface may be $Ga_gP_pSb_s$ wherein g may is 1.00, p is 0.35 and s is 0.65. In this example, the percentage of Sb in the III-V structure (I) gradually increases from the bottom to the top.

In embodiments, the composition may be changing continuously within a single layer. In other embodiments, the III-V structure (1) may be a multilayer and the composition may be changing layer by layer with each pair of adjacent layers comprising a layer facing the top surface of the III-V structure (1) and a layer facing the bottom wherein the layer facing the top surface of the III-V structure (1) has a chemical composition closer to the chemical composition of the top surface of the III-V structure (1) compared to the layer facing the bottom.

Referring to FIG. 2-4, the semiconductor structure may have the following dimensions. In embodiments, the III-V structure (1) may have a height $h_1$ of from 50 nm to 500 nm. In embodiments, the $In_aGa_bAs$ structure (3) may have a height $h_3$ of from 5 to 100 nm. In embodiments, the buffer portion (11) may have a height $h_{11}$ of from 50 to 400 nm and wherein the barrier portion (12) may have a height $h_{12}$ of from 1 to 100 nm, such as from 1 to 50 nm, or from 5 to 30 nm. In embodiments, the width of the $In_aGa_bAs$ structure (3) may be from 2 to 50 nm.

In a second aspect, the present disclosure relates to a n-type Field Effect Transistor comprising a structure according to any embodiment of the first aspect, wherein the at least one $In_aGa_bAs$ structure (3) forms a channel, wherein the Field Effect Transistor further comprises a source, a drain and a gate structure. The source and the drain are typically separated by the channel. The gate structure typically covers at least one face of the channel.

In embodiments, the n-type Field Effect Transistor may be a multi-gate Field Effect Transistor. In such a transistor, more than one face of the channel is covered by a gate structure.

In a third aspect, the present disclosure relates to a method for forming a semiconductor structure comprising the steps of:

Epitaxially growing a III-V structure (1) on a Si monocrystalline substrate (4), Epitaxially growing on the III-V structure (1) at least one $In_aGa_bAs$ structure (3), wherein the III-V structure (1) has a top surface facing away from the Si monocrystalline substrate (4), the top surface having the chemical composition $Ga_gX_xP_pSb_sZ_z$, wherein X is one or more group III element other than Ga, wherein Z is one or more group V element other than P or Sb, wherein g is from 0.80 to 1.00, x is from 0 to 0.20, z is from 0 to 0.30, p is from 0.10 to 0.55, and s is from 0.50 to 0.80, g+w is equal to 1.00 and p+s+z is equal to 1.00.

Figure 5:
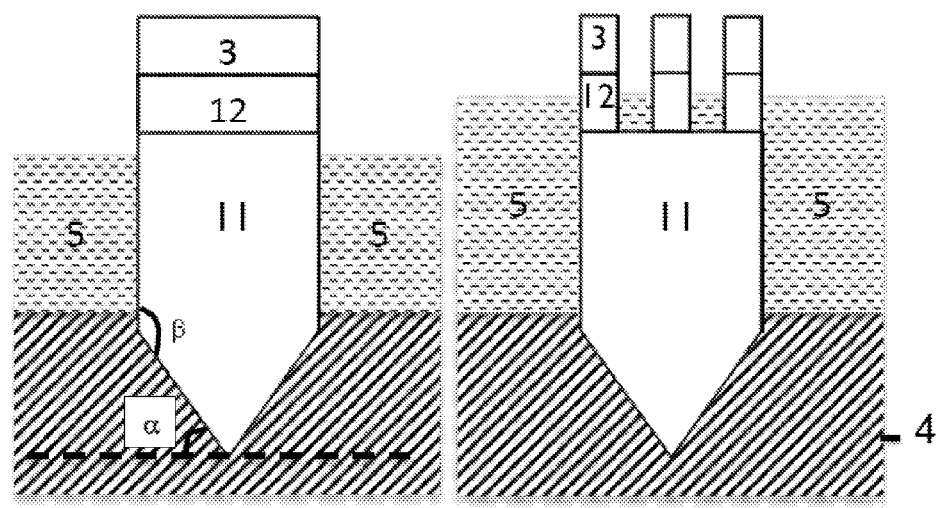
FIG. 5 is a schematic representation of a vertical cross-section of a semiconductor structure according to an embodiment of the present disclosure.

We now Refer to FIG. 5. In this embodiment, the left part of FIG. 5 is obtained by first providing a Si monocrystalline substrate (4). A non-crystalline layer (5) (e.g. a dielectric such as $SiO_2$) is then provided on the Si monocrystalline substrate (4), the non-crystalline layer (5) having an opening exposing part of the Si monocrystalline substrate (4) and forming a space (laterally) confined by non-crystalline sidewalls (5). A III-V structure (1) is then epitaxially grown on the Si monocrystalline substrate (4), within the confined space. In the case of FIG. 5, growing the III-V structure (1) comprises growing a buffer layer (11) on the Si monocrystalline substrate (4), then growing a barrier layer (12) on the buffer layer (11). Finally, an $In_aGa_bAs$ layer (3) is epitaxially grown on the III-V structure (1). We now refer to the right side of FIG. 5. The $In_aGa_bAs$ layer (3) and the barrier layer (12) are patterned (e.g. via etching trough a mask) in order to form one or more (here a plurality) of $In_aGa_bAs$ structures, thereby exposing part of the buffer layer (11) top surface. For instance, fins can be thereby produced. Finally, non-crystalline material (5) is deposited on the semiconductor structure in order to cover the exposed buffer layer (11).

Figure 6:
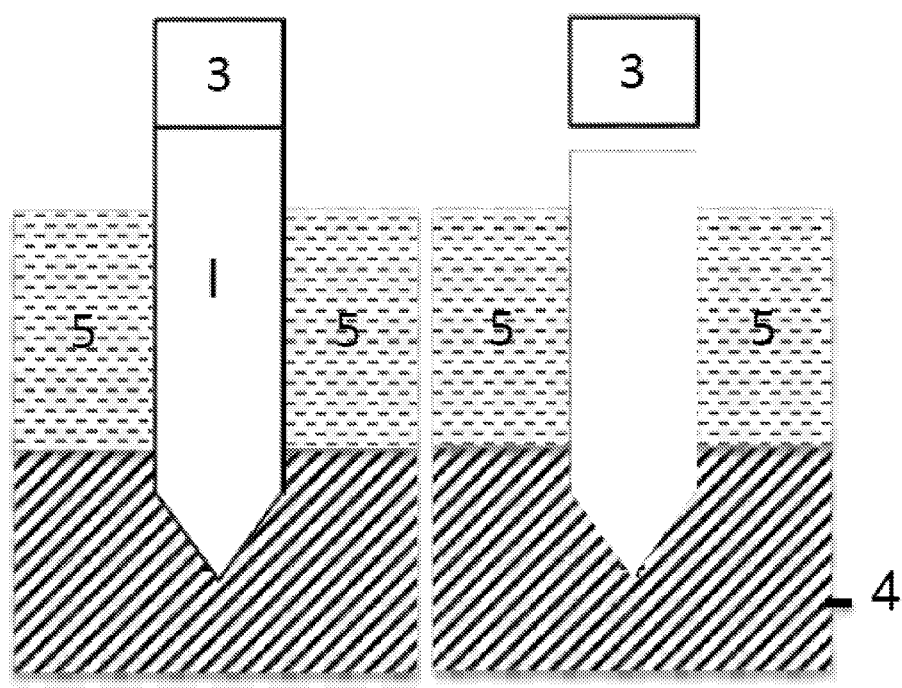
FIG. 6 is a schematic representation of a vertical cross-section of a semiconductor structure according to an embodiment of the present disclosure.
Figure 7:
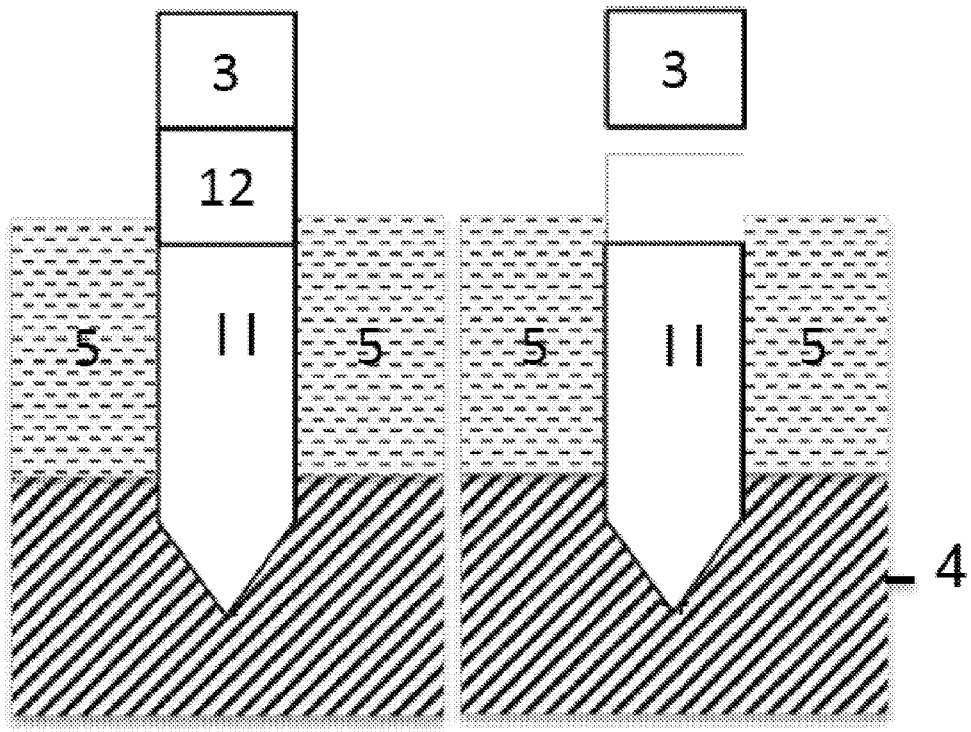
FIG. 7 is a schematic representation of a vertical cross-section of a semiconductor structure according to an embodiment of the present disclosure.

We now refer to FIG. 6 and FIG. 7. In embodiments, the method may further comprise a step c of removing the III-V structure (1) from the at least one $In_aGa_bAs$ structure (3) by selectively etching away at least part of the III-V structure (1). In FIG. 6, etching away at least part of the III-V structure (1) corresponds in etching away the entirety of the III-V structure (1). In FIG. 7, etching away at least part of the III-V structure (1) corresponds in etching away a portion (12) of the III-V structure (I), the portion being adjacent to the at least one $In_aGa_bAs$ structure (3). By using a III-V structure according to the first aspect, selective etching of the III-V structure (1) with respect to the $In_aGa_bAs$ structure (3) is rendered possible due to the difference in chemical composition between the composition of the III-V structure (1) and the $In_aGa_bAs$ structure (3). As an example, given the much higher reactivity of GaSb compared to InAs, $GaP_pSb_s$ (s>0.5) can be selectively wet etched to InAs using a Hf, $HF:H_2O_2:H_2O$ or $HCl/H_2O_2$ chemistry.

This permits to obtain $In_aGa_bAs$ structure (3) free of contact with the III-V material (I), and therefore having an additional surface (the surface that contacted the III-V material (I)) available for gating. This permits for instance to form a gate all around the $In_aGa_bAs$ structure (3) and therefore to form Gate All Around (GAA) FETs. In such a scenario, if the $In_aGa_bAs$ structure (3) is used as a channel in an FET, a gate can be present all around the $In_aGa_bAs$ structure (3) and the current through the channel can be controlled by all sides.

In embodiments, the method may therefore further comprise the step d of forming a gate structure covering the surface.

In embodiments, step a may be performed within a space confined by non-crystalline sidewalls (5), the space having a width smaller than 10 μm, for example smaller than 1 μm, or smaller than 500 nm.

In embodiments, step a and/or b may be performed by metal organic vapour phase epitaxial growth.

In embodiments corresponding to a STI last procedure, step a may comprise the following steps:

a1. epitaxially growing a III-V layer on a Si monocrystalline substrate, a2. etching a first and a second parallel trenches in the III-V layer, thereby forming III-V structures, a3. filling the parallel trenches with a non-crystalline material, a4. optionally removing any of the non-crystalline material deposited in step a3 that is not in a trench (e.g. by performing a chemical-mechanical planarization), a5. optionally forming a cavity by recessing the III-V layer, the cavity being delimited by non-crystalline sidewalls and a bottom made of the material of the III-V layer.

If no step a5 is performed, the $In_aGa_bAs$ structure may be grown on top of the III-V structure, outside of any confinement.

In step a5, the cavity may be recessed on a depth which is smaller, larger or equal to the height of the $In_aGa_bAs$ structure to be grown.

In embodiments where a barrier will be provided, step a5 may comprise forming a cavity by recessing the buffer layer on a depth which is smaller, larger or equal to the height of the combined barrier and $In_aGa_bAs$ structure to be grown.

In embodiments, one or more annealing steps may be performed during or after step a and/or during or after step b. To perform annealing during step a, an option is to grow a portion of the III-V structure, anneal, then grow a further portion, then anneal again. This process can be repeated one or more time. Annealing performed during or after step a may be performed when the III-V structure is not grown in a confined space. Such annealing may also be performed if the confined space has a ratio height/width smaller than 1.42.

Such an annealing causes some of the eventually remaining threading dislocations to migrate toward the sidewalls where they will be trapped, thereby decreasing the threading dislocation density of the buffer top surface. This annealing step can typically be dispensed of for confined spaces having an aspect ratio of 1.42 or more, or 2 or more.

In an example embodiment, the annealing temperature may be in the baking range 500-750° C. and more typically in the baking range 550-650° C. A single annealing step can be performed constantly within that baking range (e.g. at a constant temperature within that baking range) or can be performed by cycling the temperature one or more times between a temperature lower than that baking range and a temperature within that baking range. A temperature lower than that baking range could be for instance a temperature of from 350° C. to 450° C.

If cycling is performed, the number of cycles can be up to 15 times and is typically from 2 to 8 times (e.g. 5 cycles). The annealing time within the baking range per cycle may be from 1 s to 10 min, or from 1 min to 5 min. The total annealing time within the baking range may be from 2 s to 2 hours.

In embodiments, the temperature and the growth rate selected to perform step a can be adapted as follow: a higher temperature and/or a slower growth rate permit to enhance the termination of threading dislocations at the non-crystalline sidewalls. It permits therefore to achieve a better surface quality for the structure.

In embodiments, if a step a5 has been performed, step b may comprise the steps:

b1. epitaxially growing on the bottom of the cavity or on the barrier layer at least one $In_aGa_bAs$ structure, b2. Exposing the sidewalls of the $In_aGa_bAs$ structure by recessing the non-crystalline sidewalls. The purpose of this step is to facilitate source, drain and/or gate formation.

In embodiments, the semiconductor structure may be an intermediate structure in the fabrication of a CMOS semiconductor device. The semiconductor structure of the first aspect may include an n-FET or an intermediate structure in the realisation of a n-FET. In embodiments, the semiconductor structure may be a Fin-based, a nanowire-based or a nanosheet-based FET or an intermediate in the realisation thereof. In some embodiments, the semiconductor structure may be a GAA-FET such as a nanowire-based or a nanosheet-based GAA-FET. A FET is a transistor using an electric field to control the conductivity of a semiconductor channel toward one type of charge carrier. These are three-terminal devices having a first main electrode such as a source, a second main electrode such as a drain and a control electrode such as a gate for controlling the flow of electrical charges in a semiconductor channel situated between the first and second main electrodes.

A fin-based FET is a FET which channel is comprised in a semiconductor fin.

A nanowire-based FET is a FET which channel is comprised in a semiconductor nanowire.

A nanosheet-based FET is a FET which channel is comprised in a semiconductor nanosheet.

A GAA-FET is FET wherein the gate surrounds the channel region on all sides.

Typically, the channel region in a FET is a region of a semiconductor structure (e.g. a fin, a nanowire or a nanosheet) not comprising the lengthwise extremities thereof since the extremities are typically comprised in the source and the drain region of the semiconductor structure.

The space confined by non-crystalline sidewalls, i.e. the confined space, may include a width smaller than 10 microns or possibly smaller than 5 microns. A small width for the confined space may provide better trap defects at its non-crystalline sidewalls during the epitaxial growth of the III-V structure and/or during an optional subsequent annealing step. When the III-V structure grows epitaxially on the monocrystalline substrate, threading dislocations forms. These dislocations are typically not parallel to the non-crystalline sidewalls and will therefore rapidly end up at the non-crystalline sidewalls and be trapped thereon. The smaller the width of the confined space, the lower the epitaxial growth height necessary to achieve a threading dislocation-poor III-V structure top surface.

In embodiments, the width of the confined space may be smaller than 1 micron. For example, the width may be smaller than 500 nm, or optionally smaller than 200 nm, or 10 nm or less. Such very narrow confined spaces may provide effective trapping of the defects at the non-crystalline side-walls of the confined space within a growth height which is compatible with the dimensions of current and future semiconductor technologies. Using a confined space having a ratio height/width sufficient for trapping substantially all threading dislocations at the non-crystalline (e.g. dielectric) sidewalls of the confined space is called aspect-ratio trapping (ART). In ART, the sidewalls are sufficiently high relative to the width of the growth area so as to trap most, if not all, of the defects. Another influential parameter for obtaining a III-structure having a top surface with a low threading dislocation density is therefore the ratio height/width of the confined space. Indeed, when the same growth conditions are used, higher ratio automatically translates into lower defect density at the top surface of the III-V structure if the III-V structure completely fills the confined space. Therefore, in embodiments of the present disclosure, the confined space may have a ratio height/width above 1, such as above 1.42 (which appears to be a critical value typically permitting to trap most defects before they reach the top of the confined space), optionally above 2, above 3, or above 5. The height is measured perpendicularly to the substrate.

In embodiments, the non-crystalline sidewall may be a dielectric sidewall (e.g. SiO$_2$ sidewalls). The confined space may be defined in a non-crystalline (e.g. dielectric) material disposed over the top surface of the substrate. The III-V structure is epitaxially grown in the confined space.

In embodiments, the monocrystalline substrate has facets defined therein, prior to epitaxial growth. This promotes trapping of defects.

In embodiments, the base of the confined space does not simply consist in a flat horizontal surface of the substrate contacting the sidewalls but this base comprises two opposite surfaces made of the material of the substrate (e.g. carved in the substrate) and contacting corresponding opposite non-crystalline side walls at an angle beta from 100° to 170° (and more typically 90°+alpha, e.g. 144.8°, see below). These two monocrystalline surfaces may run along the length of the confined space. They may contact each other by meeting in a line inter-distant to both opposite sidewalls or they may be connected by a flat horizontal surface of the substrate.

In embodiments, the bottom of the confined space may have a v-shape.

In embodiments, the non-crystalline sidewalls may extend deeper in the substrate than the base of the confined space (e.g. deeper in the substrate than the tip of the v-shaped bottom). This situation is depicted in FIG. 8. This helps avoiding under-etching of the non-crystalline sidewalls and a possible lift off.

The angle between each of both the opposite surface and the main plane of the substrate is alpha. In the typical case wherein the opposite surfaces are each along a plane having miller index [111], and wherein the main surface of the Si substrate is along a plane having miller index [100], alpha is 54.8°.

In an example embodiment, the angle between both opposite surfaces (e.g. the angle of the "v") may be equal to 180°−2*alpha, i.e. 70.4°.

Alpha and beta are defined in FIG. 5.

The shape of the top surface of the cavity will determine the shape of the top surface of the III-V structure since the top surface of the III-V structure will have at maximum the same length and the same width as the top surface of the cavity. The shape of the top surface of the III-V structure will itself constraint the shape of the In$_a$Ga$_b$As structure since its length will at most correspond to the length of the top surface of the III-V structure while its width will be smaller, equal or at most 15% broader than the top surface of the III-V structure. In a typical case of a single In$_a$Ga$_b$As structure grown on the III-V structure, the width and the length of the group In$_a$Ga$_b$As structure may be the same as the width and the length of the top surface of the III-V structure. In embodiments, the width may be up to 15% broader. In cases where more than one In$_a$Ga$_b$As structure is grown on the III-V structure, the length of each In$_a$Ga$_b$As structure may be equal to or smaller than the length of the top surface of the III-structure while the width of each In$_a$Ga$_b$As structure may be equal, smaller or larger than the width of the top surface of the III-V structure.

The confined space (or cavity) may have the shape of a trench. This trench may be a cavity which is longer than high and longer than wide. In embodiments, the bottom of the trench may have a v-shape, e.g. a v-shape as defined above.

Having the confined space in the shape of a trench may provide a top surface for the III-V structure which is longer than wide. This in turn permits to grow one or more In$_a$Ga$_b$As structure, which will be shaped as nanowire or nanosheet wherein the length of the (horizontal) nanowire or nanosheet may for instance be equal to the length of the top surface of the III-V structure.

In embodiments, the In$_a$Ga$_b$As structure may have two extremities along its longitudinal directions and it may be secured to the substrate by having these two extremities attached to the substrate. For instance, they can be attached to the substrate by an entity not being etched during step c.

In embodiments, one extremity may be attached to a source contact and another extremity may be attached to a drain contact (the source contact and the drain contact being indirectly attached to the substrate). This is a practical way to attach the extremities of the $In_aGa_bAs$ structure to the substrate.

In embodiments, the grown $In_aGa_bAs$ structure may have the shape of a fin, a nanowire or a nanosheet. This fin, nanowire or nanosheet may comprise a channel.

Other arrangements for accomplishing the objectives of the present disclosure will be obvious for those skilled in the art.

It is to be understood that although specific embodiments, constructions and configurations, as well as materials, have been discussed herein for devices according to the present disclosure, various changes or modifications in form and detail may be made without departing from the scope of present disclosure. For example, any formulas given above are merely representative of procedures that may be used. Steps may be added or deleted to methods described within the scope of the present disclosure.

The invention claimed:

1. A semiconductor structure comprising:
   a) a Si monocrystalline substrate;
   b) a III-V structure abutting the Si monocrystalline substrate; and
   c) an $In_aGa_bAs$ structure overlaying the III-V structure, wherein a is from 0.40 to 1, b is from 0 to 0.60, and a+b is 1.00,
   wherein the III-V structure has a top surface facing away from the Si monocrystalline substrate, the top surface having a chemical composition $Ga_gX_xP_pSb_sZ_z$, wherein X is one or more group III elements other than Ga, wherein Z is one or more group V elements other than P or Sb, wherein g is from 0.80 to 1.00, x is from 0 to 0.20, z is from 0 to 0.30, p is from 0.10 to 0.55, and s is from 0.50 to 0.80, g+x is equal to 1.00 and p+s+z is equal to 1.00.

2. The semiconductor structure according to claim 1, wherein the top surface has less than $10^8$ threading dislocations per $cm^2$.

3. The semiconductor structure according to claim 1, wherein an energy level of the conduction band of the $Ga_gX_xP_pSb_sZ_z$ material of the top surface of the III-V structure is at least 0.55 eV higher than the energy level of a conduction band of the the $In_aGa_bAs$ structure.

4. The semiconductor structure according to claim 1, wherein Z comprises one or more group V element other than P, Sb or Al.

5. The semiconductor structure according to claim 1, wherein X comprises one or more elements selected from In and B.

6. The semiconductor structure according to claim 1, wherein Z comprises one or more elements selected from As and Bi.

7. The semiconductor structure according to claim 1, wherein g is 1.00, x is 0, z is 0, p is from 0.25 to 0.40, and s is from 0.60 to 0.75.

8. The semiconductor structure according to claim 1, wherein the III-V structure comprises:
   a) a buffer portion abutting the Si monocrystalline substrate; and
   b) a barrier portion, overlaying the buffer portion and comprising the top surface of the III-V structure.

9. The semiconductor structure according to claim 8, wherein the buffer portion has an upper surface comprising a material having a relaxed lattice constant matching a relaxed lattice constant of the $In_aGa_bAs$ structure.

10. The semiconductor structure according to claim 8, wherein the barrier portion comprises a material having a relaxed lattice constant which is larger than a relaxed lattice constant of the material forming the layer directly underneath the barrier portion.

11. The semiconductor structure according to claim 8, wherein the buffer portion comprises a material selected from InP, $In_aGa_bAs$, wherein the values for a and b are the same as the those selected for the $In_aGa_bAs$ structure, and $GaAs_xSb_{1-x}$ wherein x is from 0.3 to 0.7.

12. The semiconductor structure according to claim 8, wherein the barrier portion comprises a plurality of layers, the plurality of layers comprising at least two layers of different $Ga_gX_xP_pSb_sZ_z$ chemical compositions, wherein X is one or more group III elements other than Ga, wherein Z is one or more group V elements other than P or Sb, wherein g is from 0.80 to 1.00, x is from 0 to 0.20, z is from 0 to 0.30, p is from 0.10 to 0.55, and s is from 0.50 to 0.80, g+x is equal to 1.00 and p+s+z is equal to 1.00.

13. The semiconductor structure according to claim 12 wherein the plurality of layers comprises from 2 to 14 layers.

14. The semiconductor structure according to claim 12, the plurality of layers comprising at least two layers of different $Ga_gX_xP_pSb_sZ_z$ chemical compositions, wherein X is one or more group III elements other than Ga, wherein Z is one or more group V elements other than P or Sb, wherein g is 1.00, x is 0, z is 0, p is from 0.25 to 0.40, and s is from 0.60 to 0.75.

15. The semiconductor structure according to claim 14 wherein the at least two layers of different $Ga_gX_xP_pSb_sZ_z$ chemical compositions comprise:
   a) a first layer wherein p is from 0.36 to 0.40 and wherein s is from 60 to 64; and
   b) a second layer wherein p is from 0.25 to 0.34 and wherein s is from 0.66 to 0.75.

16. The semiconductor structure according to claim 1, wherein the III-V structure has a bottom surface abutting with the Si monocrystalline substrate and has a composition gradually changing from the bottom surface to the top surface, wherein the composition at the top surface has a lattice constant matching the lattice constant of the $In_aGa_bAs$ structure.

17. The semiconductor structure according to claim 16, wherein the composition at the bottom surface is GaP and wherein the composition at the top surface is $Ga_gP_pSb_s$ wherein g is 1.00, p is 0.35 and s is 0.65.

18. The semiconductor structure according to claim 1, wherein the III-V structure has a height $h_1$ from 50 nm to 500 nm.

19. A method for forming a semiconductor structure comprising:
   epitaxially growing a III-V structure on a Si monocrystalline substrate; and
   epitaxially growing on the III-V structure at least one $In_aGa_bAs$ structure, wherein the III-V structure has a top surface facing away from the Si monocrystalline substrate, the top surface having a chemical composition $Ga_gX_xP_pSb_sZ_z$, wherein X is one or more group III element other than Ga, wherein Z is one or more group V element other than P or Sb, wherein g is from 0.80 to 1.00, x is from 0 to 0.20, z is from 0 to 0.30, p is from 0.10 to 0.55, and s is from 0.50 to 0.80, g+x is equal to 1.00 and p+s+z is equal to 1.00.

20. The method according to claim 19, further comprising removing the III-V structure from the at least one $In_aGa_bAs$ structure by selectively etching away at least part of the III-V structure.

* * * * *